(12) United States Patent
Tominaga et al.

(10) Patent No.: US 7,021,418 B2
(45) Date of Patent: Apr. 4, 2006

(54) ELECTRIC POWER STEERING APPARATUS

(75) Inventors: Tsutomu Tominaga, Tokyo (JP); Tadayuki Fujimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/841,494

(22) Filed: May 10, 2004

(65) Prior Publication Data

US 2005/0167183 A1    Aug. 4, 2005

(30) Foreign Application Priority Data

Feb. 2, 2004    (JP)    .............................. 2004-025286

(51) Int. Cl.
*B62D 5/00*    (2006.01)

(52) U.S. Cl. ........................ 180/444; 310/89; 310/68 B

(58) Field of Classification Search ................ 180/444, 180/443; 310/89, 91, 67 R, 68 B, 68 R, 310/64; 74/388 PS See application file for complete search history.

(56) References Cited

U.S. PATENT DOCUMENTS

| | | | | |
|---|---|---|---|---|
| 6,078,155 | A | * | 6/2000 | Tominaga et al. .......... 318/293 |
| 6,107,716 | A | * | 8/2000 | Penketh ....................... 310/89 |
| 6,123,167 | A | * | 9/2000 | Miller et al. ................. 180/444 |
| 6,577,030 | B1 | * | 6/2003 | Tominaga et al. ........ 310/68 B |
| 6,695,091 | B1 | * | 2/2004 | Achenbach et al. ........ 180/444 |
| 6,707,185 | B1 | * | 3/2004 | Akutsu et al. ................. 310/71 |
| 2002/0118511 | A1 | * | 8/2002 | Dujari et al. ............... 361/703 |

FOREIGN PATENT DOCUMENTS

| | | |
|---|---|---|
| JP | 2000-500102 A | 1/2000 |
| JP | 2001-127921 A | 5/2002 |

* cited by examiner

*Primary Examiner*—Tony Winner
(74) *Attorney, Agent, or Firm*—Sughrue Mion, PLLC

(57) ABSTRACT

An electric power steering apparatus can improve heat dissipation of a power board. A heat sink is mounted on the power board in surface contact therewith, on which power board there is mounted a bridge circuit including a plurality of semiconductor switching elements for switching an electric current supplied to an electric motor in accordance with torque assisting a steering wheel. The heat sink has a plurality of protrusions formed on a surface thereof at a side opposite to the power board.

17 Claims, 10 Drawing Sheets

ELECTRIC POWER STEERING APPARATUS

BACKGROUND OF THE INVENTION

1. Field of the Invention

The present invention relates to an electric power steering apparatus equipped with an electric motor for generating assist torque to the steering wheel of a vehicle, and a control unit for controlling the driving of the electric motor.

2. Description of the Related Art

In the past, such an electric power steering apparatus equipped with a electric motor for generating assist torque to the steering wheel of a vehicle and a control unit for controlling the driving of the electric motor has been known, in which the control unit can be assembled separately from the electric motor and is mounted onto the electric motor in its assembled state through a bracket (for example, see a first patent document: Japanese patent application laid-open No. 2002-127921).

In this electric power steering control apparatus, the control unit has a power board on which is mounted a bridge circuit comprising a plurality of semiconductor switching elements for switching an electric current supplied to the electric motor in accordance with the torque assisting the driver's operation of the steering wheel, and a heat sink is stacked or mounted on the power board so as to dissipate the heat generated due to the operations of the semiconductor switching elements.

In the above-mentioned electric power steering control apparatus, however, there arises the following problem. That is, the heat sink, which is stacked or mounted on the power board so as to dissipate the heat generated due to the operations of the semiconductor switching elements, is of a planar configuration, so it has a limited heat dissipation area and is poor in its heat dissipation capability.

SUMMARY OF THE INVENTION

Accordingly, the present invention is intended to obviate the above-mentioned problem, and has for its object to provide an electric power steering apparatus in which the heat dissipation of a power board is substantially improved.

Bearing the above object in mind, according to the present invention, there is provided an electric power steering apparatus including an electric motor for generating assist torque to a steering wheel of a vehicle, and a control unit for controlling the driving of the electric motor. The control unit is constructed as follows. A power board has a bridge circuit mounted thereon which includes a plurality of semiconductor switching elements for switching an electric current supplied to the electric motor in accordance with the torque assisting the operation of the steering wheel. A capacitor is mounted on the power board for absorbing ripples of the electric current. A control board at least has a microcomputer mounted thereon for generating a drive signal to control the bridge circuit based on steering torque of the steering wheel. A power connector is electrically connected to a battery of the vehicle. A signal connector unit serves to input and output signals through external wiring. A plurality of motor terminals are electrically connected to the electric motor. A housing has a conductive plate constituting a wiring pattern and the motor terminals insert-molded of an insulation resin. A connection member is mounted on the power board and has a plurality of terminals built therein for electrically connecting the power board, the housing and the control board to one another. A heat sink is disposed on the power board in surface contact therewith. The heat sink has a plurality of protrusions formed on its surface at a side opposite to the power board.

According to the present invention, it is possible to improve the heat dissipation capability of the power board to a substantial extent.

The above and other objects, features and advantages of the present invention will become more readily apparent to those skilled in the art from the following detailed description of a preferred embodiment of the present invention taken in conjunction with the accompanying drawings.

DESCRIPTION OF THE PREFERRED EMBODIMENT

Now, a preferred embodiment of the present invention will be described below in detail while referring to the accompanying drawings.

In the respective figures of the accompanying drawings, the same or equivalent members and parts are identified by the same symbols throughout the following description of the preferred embodiment.

Embodiment 1.

Figure 1:
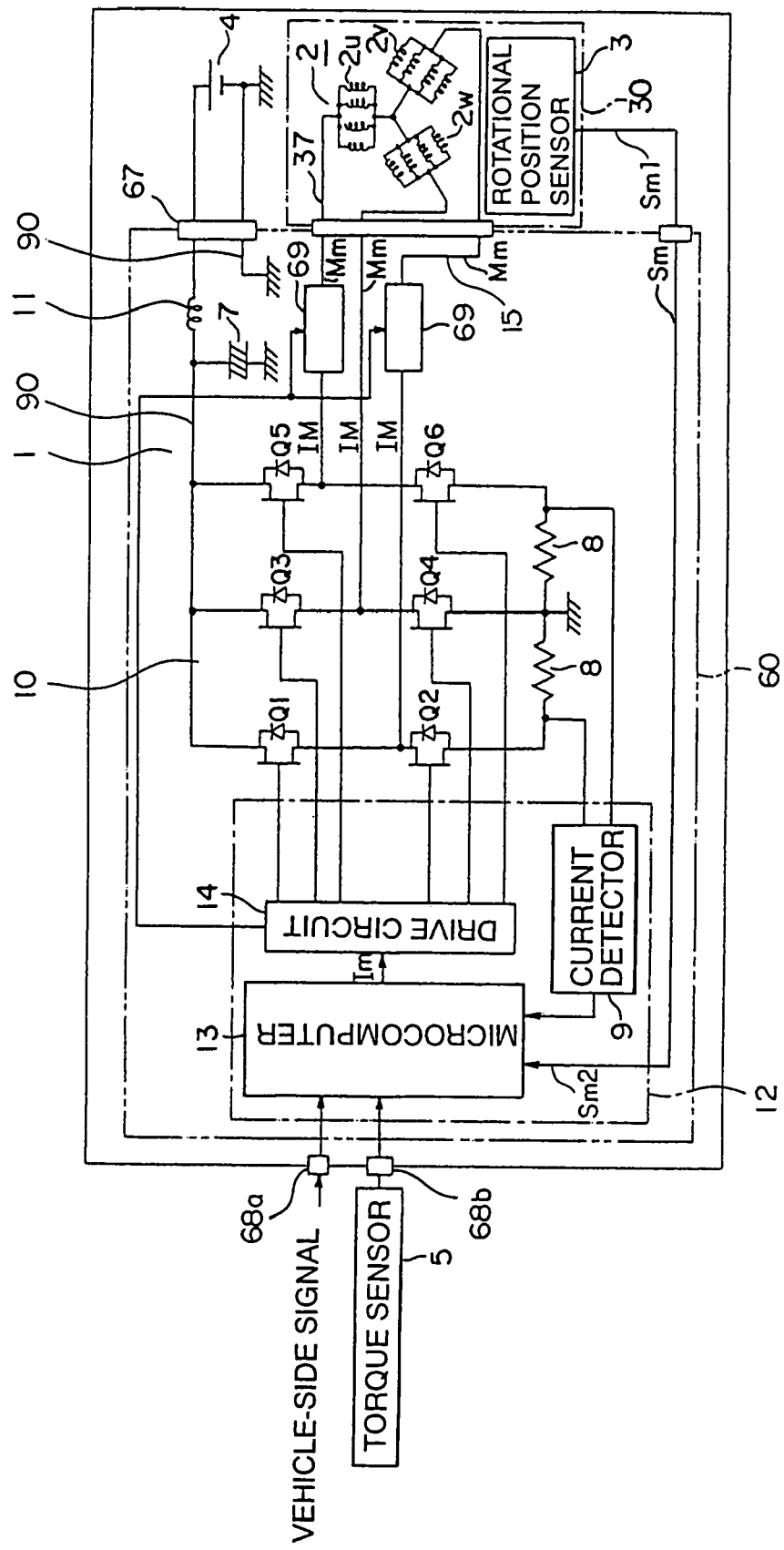
FIG. 1 is a block diagram showing an electric power steering apparatus according to one embodiment of the present invention.

In FIG. 1, an electric power steering apparatus according to the present invention includes an electric motor 30 for generating assist torque to be applied to the steering wheel of a vehicle (not shown), a control unit 60 for controlling the driving of the electric motor 30, a battery 4 for supplying electric current to the electric motor 30 for the driving thereof, a torque sensor 5 for detecting the steering torque of the steering wheel, a motor connector 15 for electrically connecting the control unit 60 and the electric motor 30 to each other, a power connector 67 for electrically connecting the battery 4 and the control unit 60 to each other, a vehicle-side signal connector 68a of a signal connector unit 68 from which a vehicle-side signal is input to the control unit 60, and a torque sensor connector 68b the signal connector unit 68 for electrically connecting the torque sensor 5 and the control unit 60 to each other.

The electric motor 30 has armature windings 2 for three phase connection in the form of a component element of a stator, and a rotational position sensor 3 for detecting the rotational position of a rotor.

The control unit 60 includes a plurality of (e.g., three in the illustrated embodiment) large-capacity capacitors 7 (e.g., about 2,200 µF for each one) for absorbing a ripple component of a motor current IM flowing through the electric motor 30, a pair of shunt resistors 8 for detecting the motor current IM, a three-phase bridge circuit 10 comprising a plurality of semiconductor switching elements (e.g., FETs) Q1–Q6 for switching the motor current IM according to the magnitude and direction of the assist torque, a coil 11 for preventing electromagnetic noise generated upon switching operation of the bridge circuit 10 from flowing out to the outside, and a control circuit 12 to be described later in detail.

The control circuit 12 includes a current detector 9 connected across opposite ends of the serially connected shunt resistors 8 for detecting the electric current supplied to the electric motor 30, a microcomputer 13 for calculating the assist torque required based on a steering torque signal from the torque sensor 5 as well as calculating an amount of electric current corresponding to the assist torque thus obtained based on the motor current IM and the rotational position of the rotor in a feedback manner, and a drive circuit 14 for generating a drive signal to control the bridge circuit 10 based on a command from the microcomputer 13 and for outputting it to the bridge circuit 10.

The microcomputer 13 includes, in addition to an AD converter, a PWM timer circuit and the like, a well-known self-diagnosis function to always perform self-diagnosis as to whether the system is operating normally, so that it operates to interrupt the motor current IM upon occurrence of an abnormality.

In the electric power steering apparatus as constructed above, the microcomputer 13 takes in the steering torque from the torque sensor 5 and the rotational position of the rotor of the electric motor 30 from the rotational position sensor 3. Also, the microcomputer 13 takes in a vehicle-side signal, and the motor current IM is fed back to the microcomputer 13 from the shunt resistors 8 through the current detector 9. Further, the microcomputer 13 creates a power steering rotational direction command and a quantity of current control corresponding to the assist torque, respectively, which are input to the drive circuit 14. The drive circuit 14, when supplied with the rotational direction command and the current control quantity, generates a PWM drive signal which is then applied to the semiconductor switching elements Q1–Q6 of the bridge circuit 10. As a result, electric current flows from the battery 4 to the electric motor 30 through external wiring, the power connector 67, the coil 11, the bridge circuit 10, motor relays 69 and the motor connector 15, so that the electric motor 30 can produce a required quantity of assist torque in a required direction.

At this time, the motor current IM is detected by the shunt resistors 8 and the motor current detector 9 so that it is fed back to the microcomputer 13, whereby the motor current IM is controlled so as to coincide with a motor current command Im. In addition, the motor current IM, including a ripple component resulting from the switching operation of the bridge circuit 10 at the time of the PWM driving operation thereof, is smoothened by the large-capacity capacitors 7. Further, the coil 11 serves to prevent the noise generated by the switching operation of the bridge circuit 10 during the PWM driving operation thereof from being discharged to the outside to become radio noise.

Next, reference will be made to the concrete structure of the electric power steering apparatus as mentioned above based on the accompanying drawings.

Figure 2:
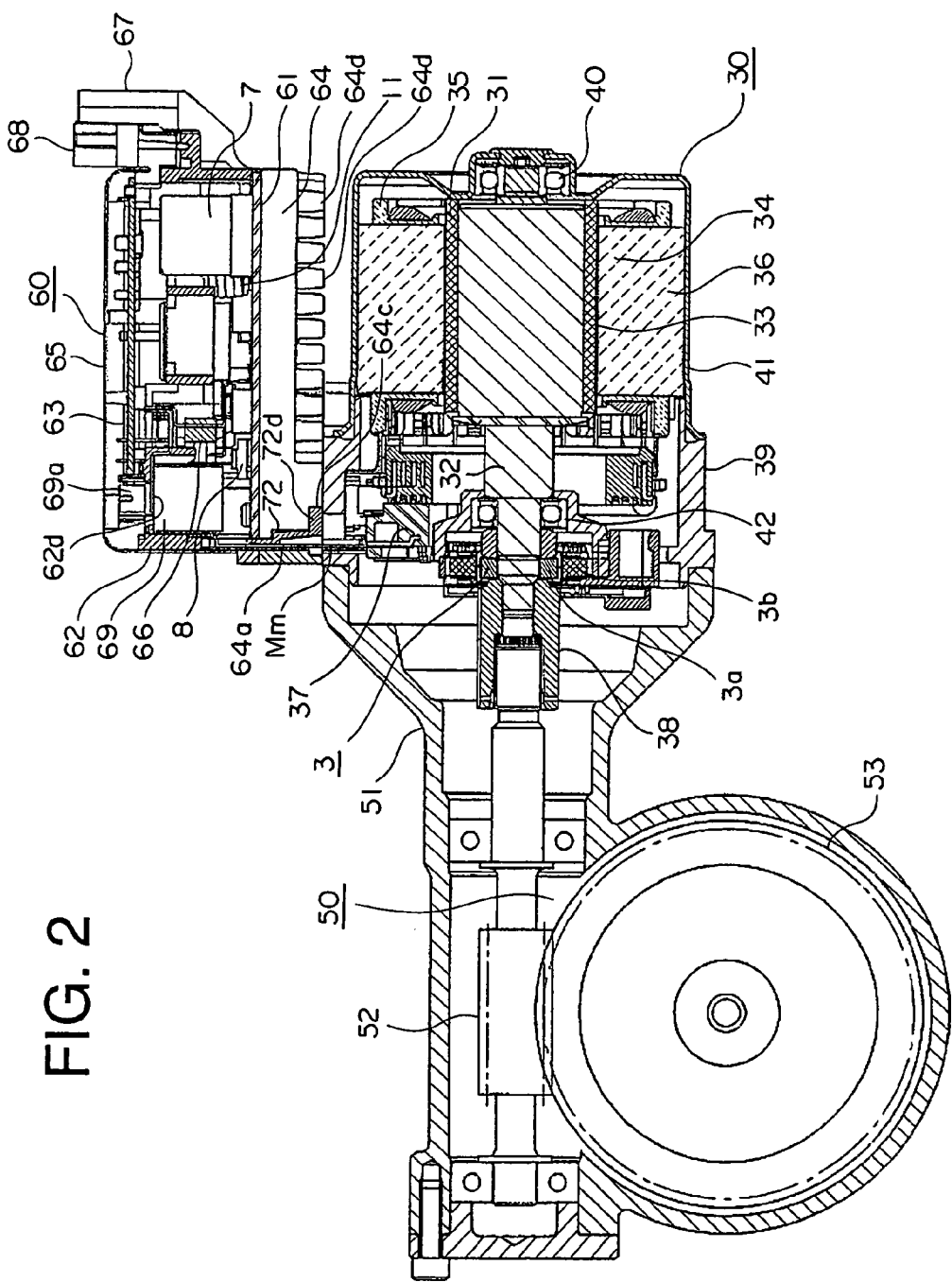
FIG. 2 is a cross sectional view showing the electric power steering apparatus of FIG. 1.
Figure 3:
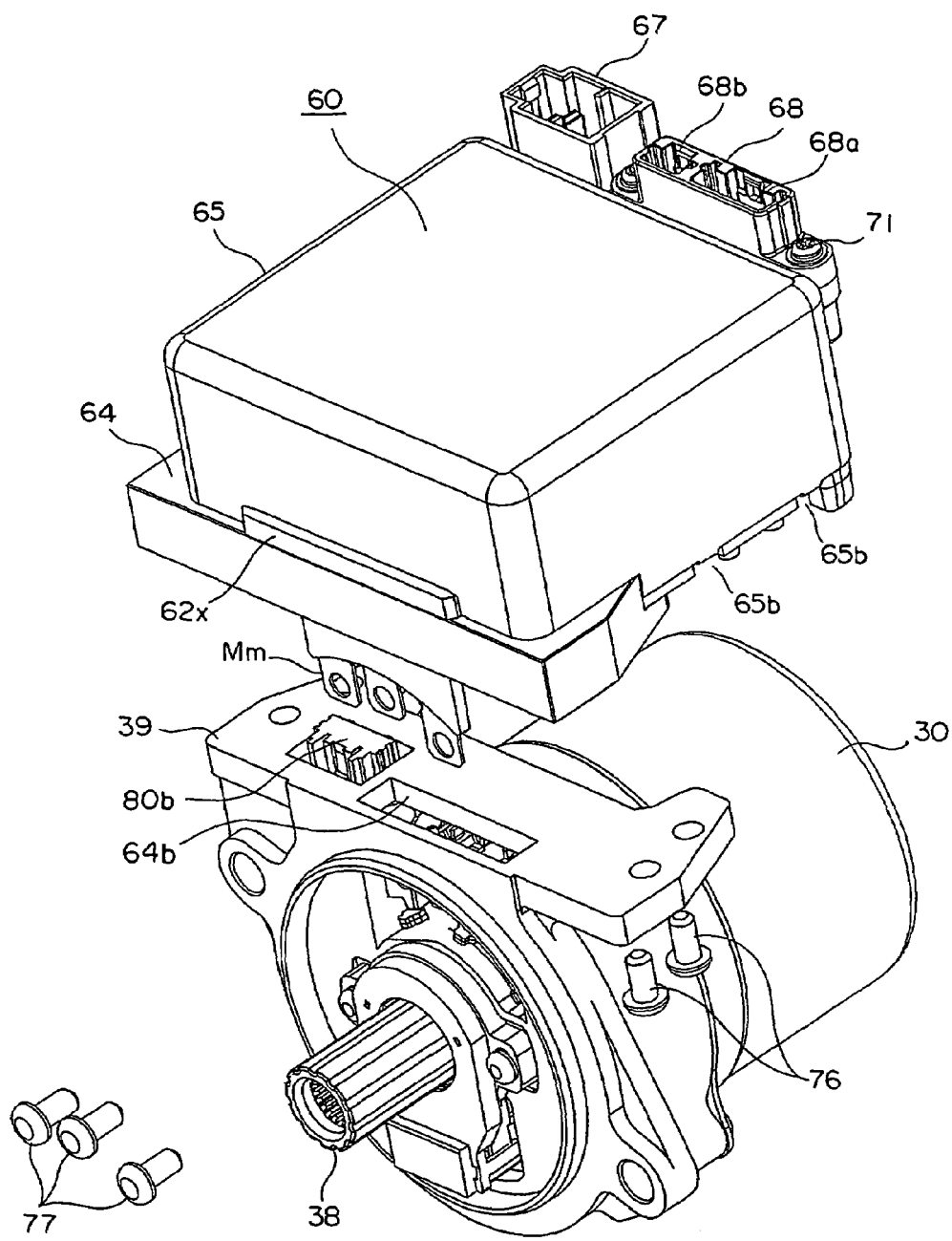
FIG. 3 is an exploded perspective view showing the electric power steering apparatus of FIG. 1.

FIG. 2 is a cross sectional view showing the electric power steering apparatus as explained with reference to FIG. 1, and FIG. 3 is an exploded perspective view showing the electric power steering apparatus of FIG. 2.

The electric motor 30, being a three-phase blushless motor of this electric power steering apparatus, includes an output shaft 32, a rotor 33 having a permanent magnet 31 with eight magnetic poles fixedly attached to the output shaft 32, a stator 36 arranged around the rotor 33, and the rotational position sensor 3 arranged at an output side of the output shaft 32 for detecting the rotational position of the rotor 33.

The stator 36 has twelve salient poles 34 in opposition to the outer periphery of the permanent magnet 31, an insulator 35 attached to these salient poles 34, and armature windings 2 ($2u$, $2v$, $2w$) wound around the insulator 35 and connected with three-phases U, V and W. The armature windings 2 have their three end portions connected with three winding terminals 37, respectively, extending toward the output shaft 32.

The rotational position sensor 3 is composed of a resolver, and has a rotor $3a$ and a stator $3b$. The outside diameter or contour of the rotor $3a$ is formed into a special curve so that the permeance of a diametral clearance or gap between the stator $3b$ and the rotor $3a$ changes in a sinusoidal manner at a relative angle therebetween. An exciting coil and two sets of output coils are wound around the stator $3b$ for detecting a change in the diametral gap between the rotor $3a$ and the stator $3b$ to generate two-phase output voltages that change in a sine wave and in a cosine wave.

A speed reduction gear 50 is fixedly secured to the electric motor 30, and it includes a gear case 51 coupled with a bracket 39 of the electric motor 30, a worm gear 52 disposed in this gear case 51 for reducing the rotational speed of the output shaft 32, and a worm wheel 53 arranged in meshing engagement with this worm gear 52. The worm gear 52 is formed, at an end portion thereof near the electric motor 30, with a spline. A coupling 38 with a spline formed on its inner side is press-fitted into an end portion of the output shaft 32 remote from the rotor 33. The coupling 38 and the splined end portion of the worm gear 52 are coupled with each other through the splines formed thereon, so that torque is transmitted from the electric motor 30 to the speed reduction gear 50.

Figure 4:
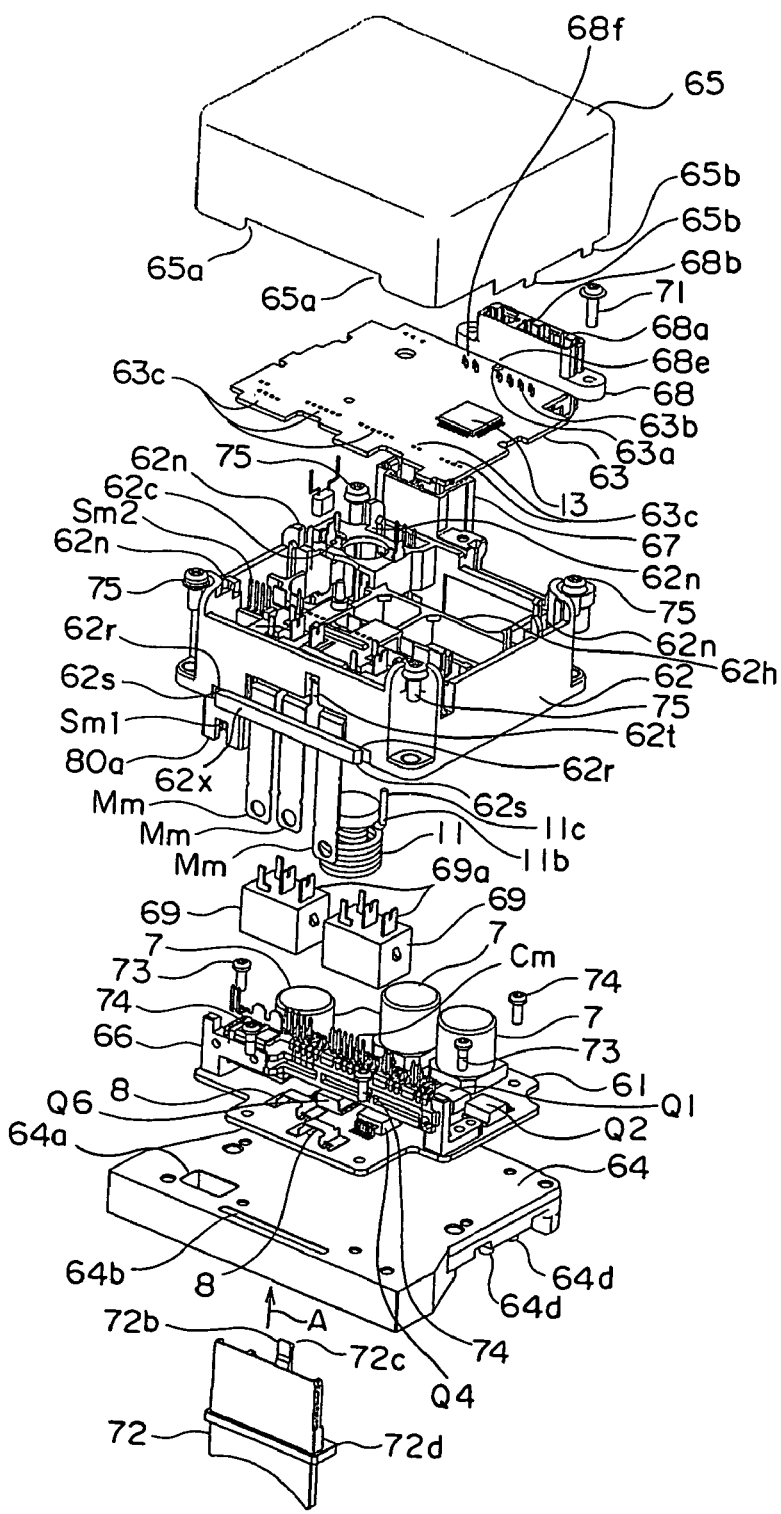
FIG. 4 is an exploded perspective view showing a control unit of FIG. 1.

FIG. 4 is an exploded perspective view showing the control unit 60 of FIG. 2.

The control unit 60 has a power board 61, a housing 62 having a substantially box-shaped outer configuration, a control board 63 comprising an insulated printed-circuit board, a heat sink 64 that is made of aluminum, has high thermal conductivity and is stacked or mounted on the power board 61, and a metal casing 65 fixedly attached to this heat sink 64 so as to enclose therein the power board 61, the housing 62, the control board 63, etc.

The heat sink 64 with the casing 65 fixedly attached thereto is fixedly secured to the bracket 39 of the electric motor 30 in parallel to the central axis of the electric motor 30. A lot of columnar protrusions $64d$ are formed on one side of the heat sink 64 near the electric motor 30 so as to increase the heat dissipation area of the heat sink 64.

The power board 61 is made of an HITT substrate (the trade name of a product manufactured by Denki Kagaku Kogyo, Ltd.), for instance, with a wiring pattern being formed on an aluminum substrate of 2 mm thick as a copper pattern of 100 μm thick through an insulating layer of 80 μm thick. The switching elements Q1–Q6, which constitute the bridge circuit 10 for switching the electric current of the electric motor 30, the capacitors 7 for absorbing ripples in the motor current IM, large-current parts such as the shunt resistors 8 for detecting the electric current of the electric motor 30, and connector terminals Cm of a connection member 66 are respectively mounted on the wiring pattern on the power board 61 by means of soldering.

The connection member 66 connects the power board 61 and the housing 62 to each other, and has the connector terminals Cm formed by insert molding for connecting the power board 61 and the control board 63 to each other.

The wiring pattern formed on the power board 61 each have a cross sectional capacity enough to accommodate a large current so that circuit elements adapted for the large current flowing through the electric motor 30 can be mounted on the wiring pattern.

The microcomputer 13 and peripheral circuit elements (small-current parts) including the drive circuit 14 and the motor current detection circuit 9 are mounted by soldering onto the wiring pattern on the control board 63. Here, note that in FIG. 4, such peripheral circuit elements (small-current parts) including the drive circuit 14 and the motor current detection circuit 9 are omitted for convenience and easy understanding.

The housing 62 is integrally formed on its side with the power connector 67, and is mounted on the heat sink 64 so as to cover the power board 61. The housing 62 is formed of insulation resin by insert molding, and has a plurality of conductive wires and a wiring pattern comprising a conductive plate provided at its one end with motor terminals Mm. The plurality of conductive wires and the conductive plate are exposed from the housing 62 for electrical connection with other parts or elements. In addition, the control board 63 is mounted on the upper end surface of the housing 62 in a vertically overlapping relation with respect to the power board 61.

The housing 62 has sensor terminals for sending a signal from the rotational position sensor 3 to the microcomputer 13. One ends Sm2 of the sensor terminals protruding from the housing 62 toward the control board 63 are electrically connected with the control board 63, whereas the other ends Sm1 of the sensor terminals are electrically connected with the rotational position sensor 3 of the electric motor 30 through a hole 64*a* formed in a corner portion of the heat sink 64.

The motor terminals Mm protruding from the housing 62 to the heat sink 64 side is inserted into the electric motor 30 through an opening 64*b* formed in an edge portion of the heat sink 64, and is electrically connected with the winding terminals 37. The motor terminals Mm have three electric paths arranged in parallel with one another, and the motor relays 69, which constitute a switch for turning on and off the motor current IM supplied from the bridge circuit 10 to the electric motor 30, are connected in series with the outer two of the three electric paths, respectively. Each of the motor relays 69 has a pair of mutually facing terminals 69*a* arranged in parallel with each other at an upper portion thereof.

Figure 5:
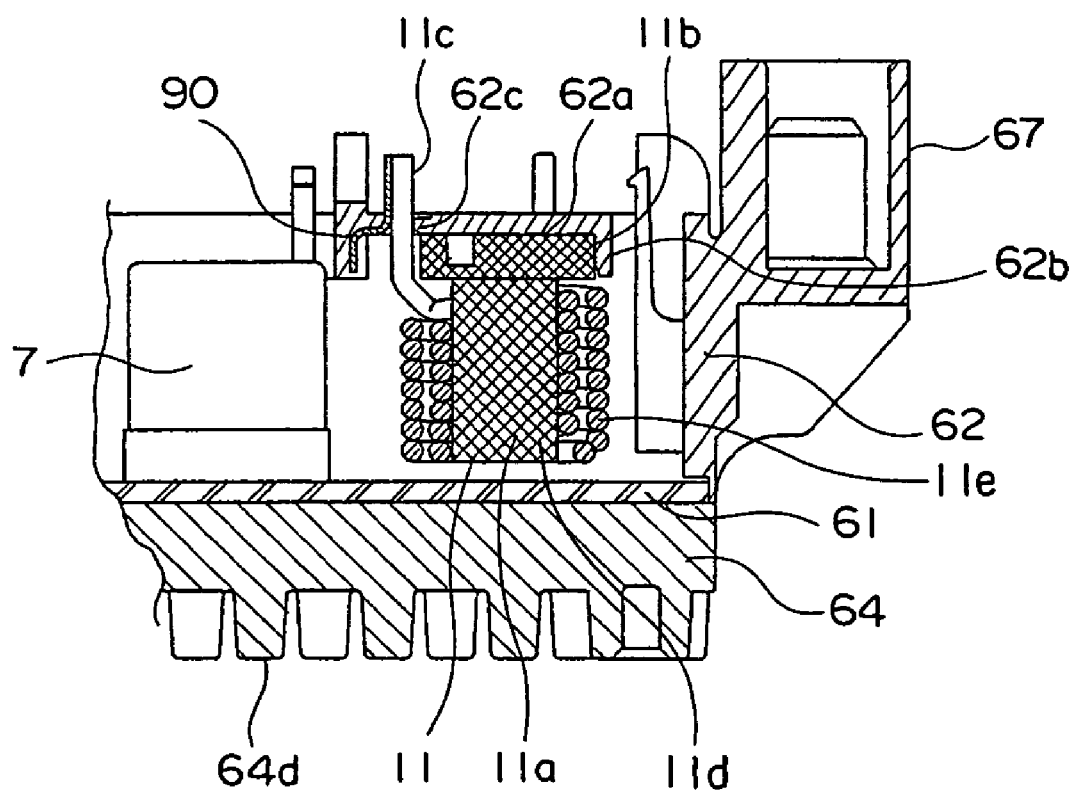
FIG. 5 is a partial cross sectional view including a coil of the control unit of FIG. 1.

The housing 62 is formed with a coil receiving portion 62*a* having a holder portion 62*b* projected from its peripheral edge portion thereof for receiving the coil 11 inserted from a lower side thereof, as shown in FIG. 5. The coil 11 includes a core 11*a* of a T-shaped cross-sectional configuration having a large-diameter portion 11*b* and a small-diameter portion 11*d*, and a coil portion 11*e* wound around the small-diameter portion 11*d* of the core 11*a*. The coil receiving portion 62*a* is constructed such that the inner diameter of the holder portion 62*b* is smaller than the outer diameter of the large-diameter portion 11*b* of the core 11*a* at the time before the coil 11 is received in the coil receiving portion 62*a*. The large-diameter portion 11*b* of the core 11*a* is press-fitted into the holder portion 62*b*, whereby the coil 11 is firmly held by the holder portion 62*b*. The coil 11 has its terminals 11*c* which extend through holes 62*c* formed in the coil receiving portion 62*a* so as to be protruded from the upper surface of the housing 62 so that they are electrically connected through welding with corresponding conductive plates 90 exposed from the insulation resin of the housing 62.

Figure 6:
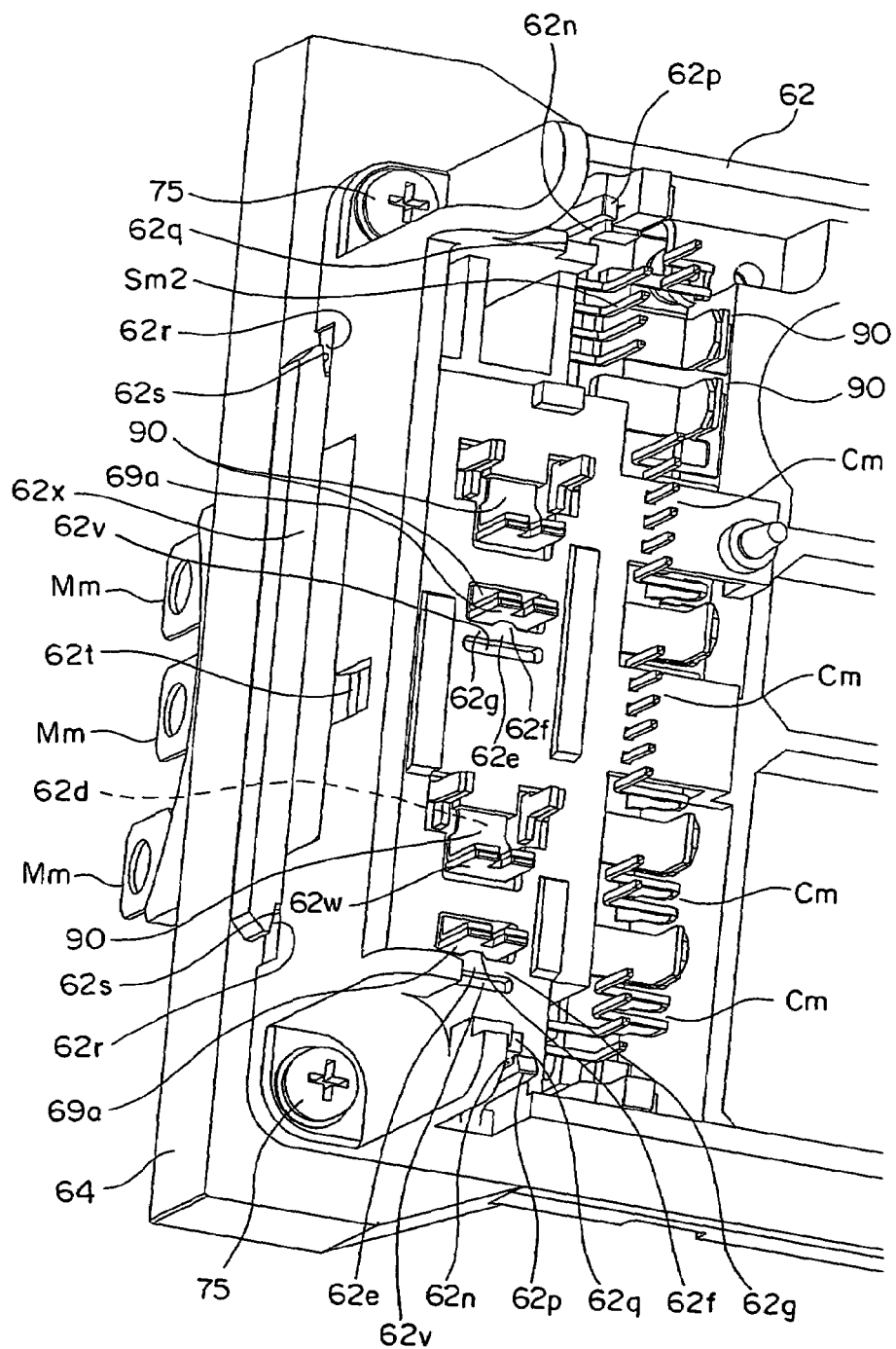
FIG. 6 is a partial perspective view including terminals of motor relays of the control unit of FIG. 1.

Moreover, the housing 62 has relay receiving portions 62*d* for receiving the motor relays 69 fitted therein from a lower side thereof, and switch-holding portions 62*e* each formed on the bottom of a corresponding relay receiving portion 62*d* for holding the terminals 69*a* of a corresponding motor relay 69, as shown in FIG. 6. Each of the switch-holding portions 62*e* has a low-rigidity portion 62*g* that has a width between an elongated hole 62*v* and a through hole 62*w* narrowed by the elongated hole 62*v*, and a convex portion 62*f* that is formed in an intermediate portion of the low-rigidity portion 62*g* so as to protrude toward the terminal 69*a* side.

In a state before the motor relays 69 are received in the relay receiving portions 62*d*, the gap or clearance between a convex portion 62*f* and a corresponding conductive plate 90 exposed from the insulation resin of the housing 62 is formed to be narrower than the thickness of the terminals 69*a* of the corresponding motor relay 69. When the motor relays 69 are received into the relay receiving portions 62*d*, the gap is forced to expand by the terminals 69*a*, whereby the terminals 69*a* are pressed against the conductive plate 90 side by the resilient force of the low-rigidity portions 62*g* generated due to their elastic deformation, thereby holding the motor relays 69 against the housing 62.

The terminals 69*a* of the motor relays 69 extend through the through holes 62*w* in the relay receiving portions 62*d* to protrude from the upper surface of the housing 62, so that they are welded and electrically connected with the conductive plates 90.

Though the width of each of low-rigidity portions 62*g* between the through holes 62*w* and the elongated holes 62*v* is formed to be narrow with the formation of the elongated holes 62*v*, the material for those parts which are in abutment against the terminals 69*a* of the motor relays 69 may be made of an elastic material that can be pressed against the terminals 69*a* under their own resilient forces.

Figure 7:
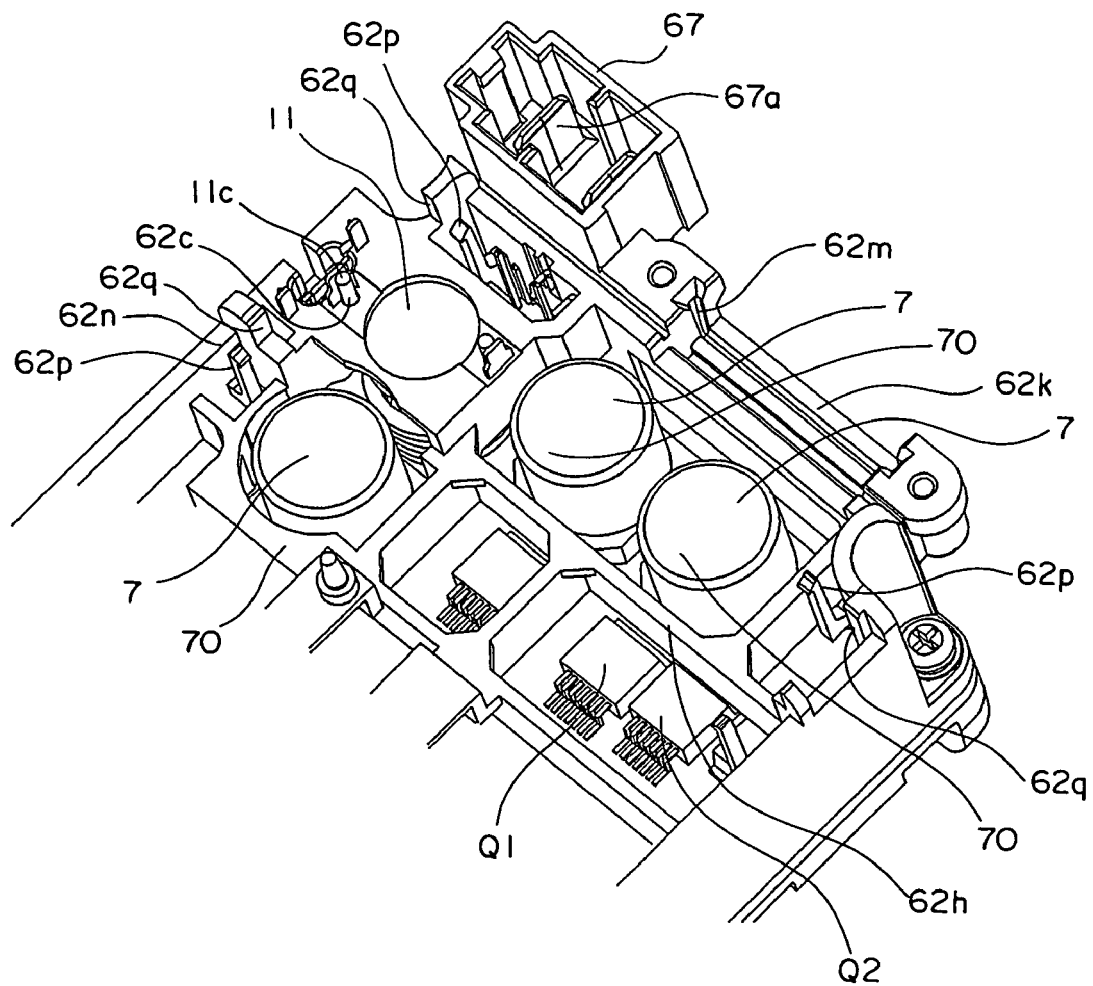
FIG. 7 is a partial perspective view including the coil, capacitors, etc., of the control unit of FIG. 1.

Further, inside the housing 62, there are arranged beams 62*h* for connecting between the opposing side walls of the housing to increase the rigidity thereof, as shown in FIG. 7. Each of the beams 62*h* has its top end surface substantially flush with that of each capacitor 7 in the neighborhood of the side thereof. The upper end portion of each capacitor 7 is fixedly attached to the upper end portion of an adjacent one of the beams 62*h* by means of a silicon adhesive 70.

In addition, the power connector 67 integrally molded with the housing 62 is arranged at a corner of the housing 62. This power connector 67 has terminals 67*a* that are one ends of the conductive plates 90 electrically connected with the coil 11. The terminals 67*a* of the power connector 67 are electrically connected with the battery 4 of the unillustrated vehicle.

The control board 63 has a holding hole 63a formed in one side edge portion thereof, as shown in FIG. 4. The signal connector unit 68 has a convex portion 68e that is press-fitted into the holding hole 63a thereby to fixedly attach the signal connector 68 to the control board 63. This signal connector unit 68 is composed of the vehicle-side signal connector 68a to and from which a vehicle-side signal is input and output through external wiring, and the torque sensor connector 68b to which a signal from the torque sensor 5 is input, these connectors 68a, 68b being molded integrally with each other by means of an insulation resin. The power connector 67 and the signal connector unit 68 are disposed in the axial direction of the electric motor 30 at a side opposite to the motor terminals Mm with the connection member 66 interposed therebetween. Here, note that the torque sensor connector 68b and the vehicle-side signal connector 68a may be formed separately from each other instead of the integral formation.

Figure 8:
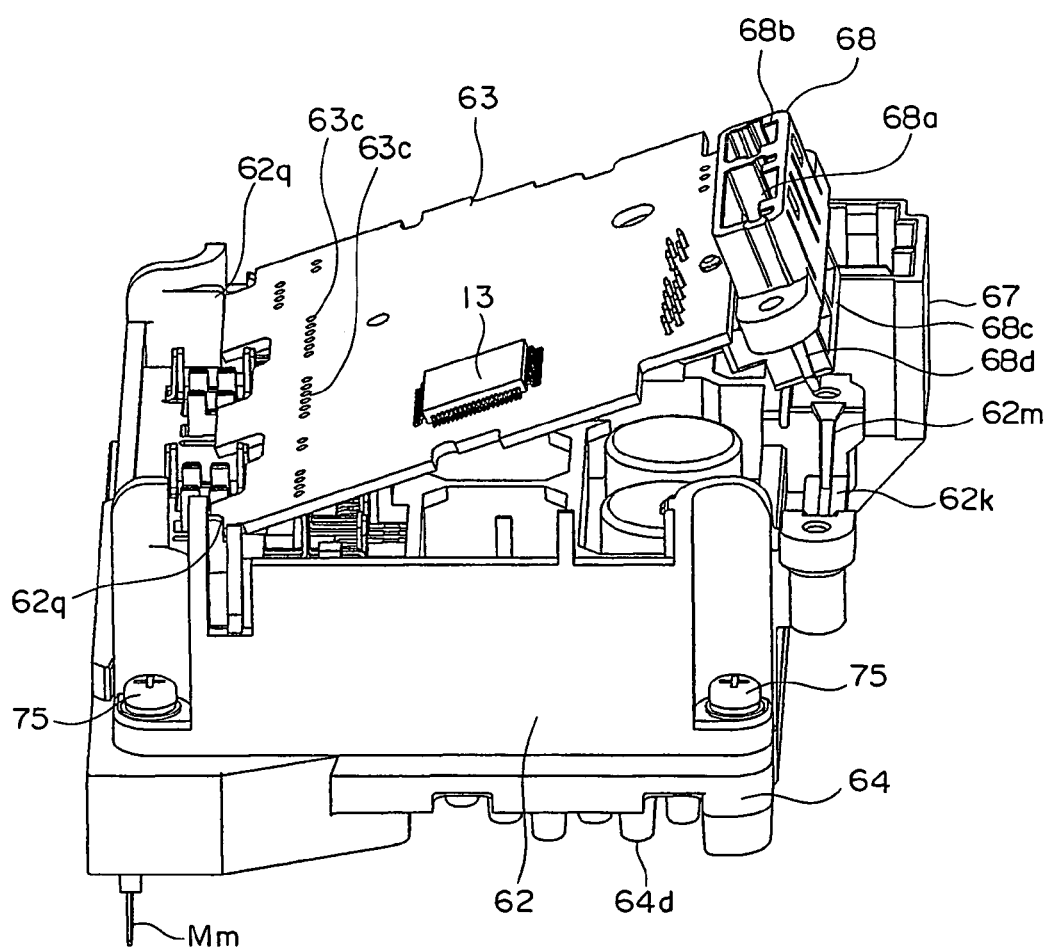
FIG. 8 is a perspective view showing the state in which a control board is being assembled to a housing of the control unit of FIG. 1.

As shown in FIG. 8, the housing 62 has a concave portion 62k formed in a side wall thereof arranged in parallel with a row of connector terminals Cm of the connection member 66 fixedly attached to the power board 61, and the signal connector unit 68 has a convex portion 68c that is inserted into the concave portion 62k. In the inner wall surface of the concave portion 62k of the housing 62, there is formed an engagement groove 62m that extends in a line and has a wide inlet opening. The convex portion 68c of the signal connector unit 68 is formed on its outer wall with an engagement protrusion 68d that extends linearly so as to enclose the outer wall of the convex portion 68c. The widths of the engagement groove 62m and the engagement protrusion 68d in the thickness direction of the side wall of the housing 62 gradually increase upwardly from the bottom of the concave portion 62k.

When the convex portion 68c of the signal connector unit 68 is inserted into the concave portion 62k of the housing 62, the engagement protrusion 68d is guided and inserted from the wide inlet opening of the engagement groove 62m into the interior of the engagement groove 62m, so that it is finally fitted into the engagement groove 62m, thereby bringing the signal connector unit 68 into fitting engagement with the housing 62.

Figure 9:
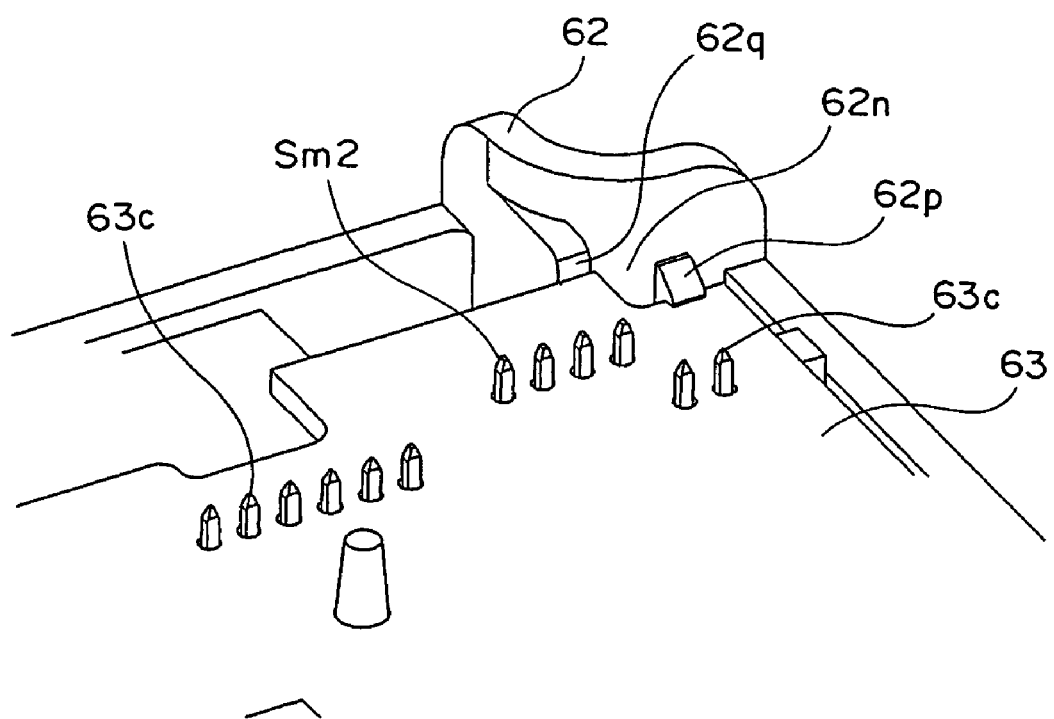
FIG. 9 is a partial perspective view including an engaging portion of the housing of the control unit of FIG. 1.

As shown in FIG. 9, the control board 63 is engaged by engaging members 62n (only one being illustrated) formed on the housing 62 at its opening. Each of the engaging members 62n has a fallout-preventing or stopper portion 62p of a hook-shaped configuration for preventing fallout of the control board 63, and a positioning portion 62q formed near the stopper portion 62p for positioning the control board 63 in its surface direction.

The control board 63 has through holes 63b formed therein in the neighborhood of the signal connector unit 68, as shown in FIG. 4. The signal connector unit 68 has terminals 68f that are adapted to be fitted into the through holes 63b. Also, the control board 63 has through holes 63c formed therein, through which the connector terminals Cm and the sensor terminals Sm2 extend.

The casing 65 is made of iron, and it is mounted on the heat sink 64 so as to cover the power board 61, the housing 62 and the control board 63. As shown in FIG. 6, the housing 62 is formed, at a lower end portion of a side surface thereof, with a horizontally extending engaging portion 62x. The engaging portion 62x has cut portions 62r formed at its opposite ends, respectively. The cut portions 62r have sloped or inclined surfaces 62s, respectively, increasing gradually in longitudinally outward directions of the engaging portion 62x. The casing 65 is formed at its lower end portion with a pair of engagement portions 65a (see FIG. 4) that are press-fitted into the cut portions 62r, respectively. Also, caulking pieces 65b are formed on the lower end portion of the casing 65 so that the casing 65 is fixedly attached to the heat sink 64 by caulking the caulking piece 65b.

Figure 10:
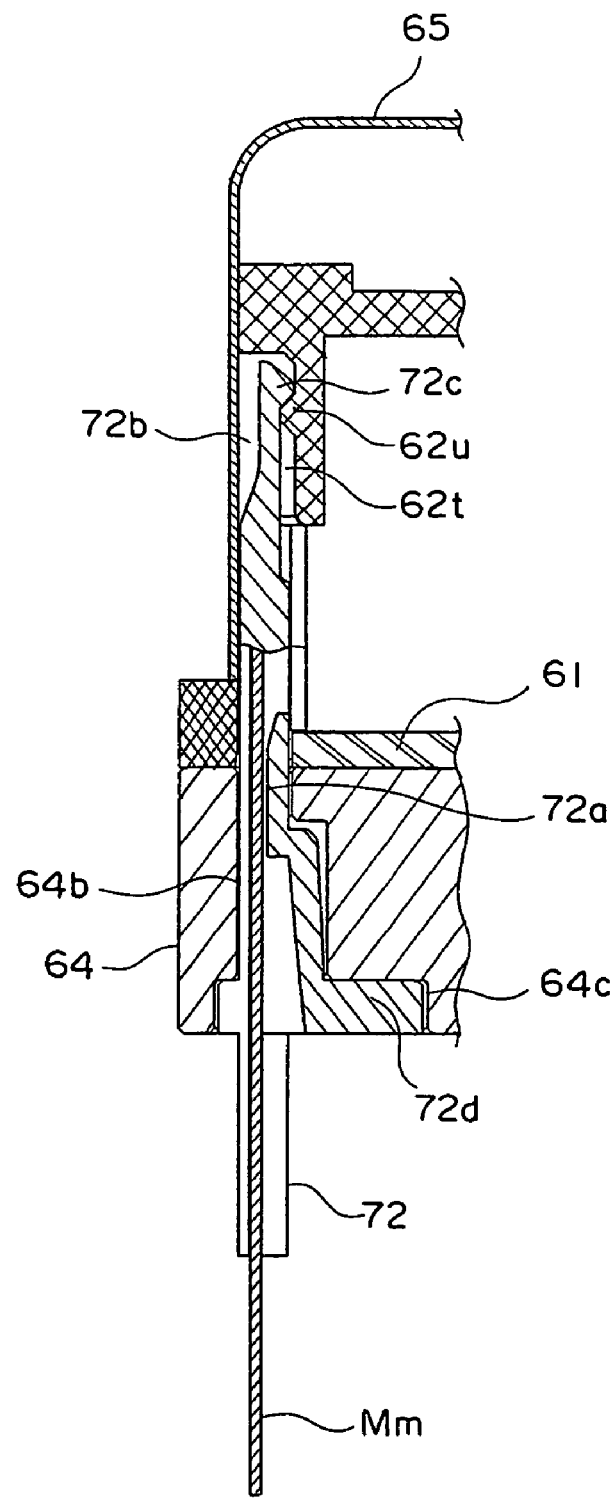
FIG. 10 is a partial cross sectional view including a cap of FIG. 3.

A cap 72 made of an insulation resin is inserted into the opening 64b of the heat sink 64 from the direction of arrow A in FIG. 4. The cap 72 has a plurality of through holes 72a formed therein, as shown in FIG. 10. These through holes 72a are arranged vertically in three rows in parallel with one another with respect to the plane of the sheet of FIG. 10, so that the motor terminals Mm electrically connected with the armature windings 37 extend through the individual through holes 72a.

The cap 72 is formed at its upper portion with an engaging portion 72b having a triangular-shaped convex portion 72c formed at one end thereof. On the other hand, the housing 62 is formed at its side wall with a groove 62t into which the engaging portion 72b is inserted. The cap 72 has a convex portion 62u of a triangular cross section formed in the groove 62t for engagement with the triangular-shaped convex portion 72c.

The cap 72 is also formed at its intermediate portion with a flange 72d extending in parallel to the heat sink 64. The heat sink 64 has a concave portion 64c formed on the inner periphery of the opening 64b so as to accommodate or receive the flange 72d. The cap 72 is fixedly secured to the heat sink 64 with the flange 72d being clamped by the concave portion 64c of the heat sink 64 and the bracket 39.

Now, reference will be made to a procedure of assembling the electric power steering apparatus as constructed above.

First of all, the electric motor 30 is assembled in the following manner. After the permanent magnet 31 is fixed through bonding to the output shaft 32, it is magnetized by means of a magnetizer so as to form eight poles, and an inner race of a first bearing 40 is press-fitted over the permanent magnet 31 to produce the rotor 33.

Then, the armature windings 2u, 2v, 2w of respective three-phases U, V and W are wound around the twelve salient poles 34 of the stator 36 through the insulator 35. These armature windings 2u, 2v, 2w are wound while being displaced an electrical angle of 120 degrees from one another, and each of the armature windings 2u, 2v, 2w are formed of four pieces of winding portions. The respective U-phase winding portions have their winding-start ends and winding-termination ends connected with one another to form the U-phase armature winding 2u, and the V-phase and W-phase armature windings 2v, 2w are formed in the same manner. After formation of the armature windings 2u, 2v, 2w of the U, V and W phases, the winding-termination ends thereof are mutually connected with one another to provide a neutral point, whereas the winding start ends of the armature windings 2u, 2v, 2w of the U, V and W phases are connected with the winding terminals 37, respectively.

Thereafter, the stator 36 thus assembled is press-fitted into a yoke 41.

Subsequently, after an outer race of a second bearing 42 is fixedly secured to the bracket 39, the output shaft 32 of the rotor 33 is press-fitted into an inner race of the second bearing 42, and the rotor 3a of the rotational position sensor 3 and the coupling 38 are press-fitted over the output shaft 32. Further, the stator 3b of the rotational position sensor 3 is fixedly attached to the bracket 39. Then, the yoke 41, into which the stator 36 has been built, is inserted into the bracket 39, and is fixedly secured thereto by means of screws (not shown).

Next, reference will be made to a procedure of assembling the control unit 60.

First of all, parts such as the microcomputer 13, its peripheral circuit elements, etc., are arranged on the control board 63 having respective electrodes thereon coated with a cream solder, and by using a reflow device, the control board 63 or the entire atmosphere therearound is heated from its lower side so that the cream solder is melted to fixedly connect the respective parts with one another through soldering.

Similarly, other parts such as the semiconductor switching elements Q1–Q6, the capacitors 7, the shunt resistors 8, etc., are arranged on the power board 61 having respective electrodes thereon coated with a cream solder, and the connection member 66 is placed on the power board 61 and is fixedly fastened thereto by using screws 73. The respective parts and the terminals of the connection member 66 are soldered by melting the cream solder by the use of the reflow device.

Subsequently, the coil 11 and the motor relays 69 are placed at prescribed positions in the housing 62. At this time, the large-diameter portion 11b of the core 11a is press-fitted into the holder portion 62b of the housing 62, whereby the coil 11 is held in place, as shown in FIG. 5. In addition, as shown in FIG. 6, the motor relays 69 are constructed such that the gaps between the convex portions 62f of the switch-holding portions 62e and the conductive plates 90 exposed from the housing 62 are narrower than the terminals 69a. Therefore, upon insertion of the motor relays 69, the gaps are forced to expand by the terminals 69a, whereby the terminals 69a are urged against the conductive plates 90 by the resilient force of the low-rigidity portions 62g, so that the motor relay 69 is firmly held by the housing 62.

Thereafter, these parts are connected through welding with the conductive plates 90 and the motor terminals Mm while being held by the housing 62.

Then, the power board 61 is placed from above onto the heat sink 64, and it is fixedly fastened thereto by screws 74, after which the housing 62 is arranged on the power board 61, and it is fixed thereto by screws 75. At this time, since the power board 61 is firmly fastened to the heat sink 64 by the screws 74 at its four corners, the power board 61 is placed in intimate contact with the heat sink 64. After that, the conductive plates 90 and the motor terminals Mm, which are exposed from the insulation resin of the housing 62, are electrically connected through welding with connector terminals Cm, respectively, of the connection member 66 on the power board 61.

Thereafter, the upper portions of the capacitors 7 are fixedly adhered or bonded to the upper portions of the beams 62h of the housing 62 by means of the adhesive 70.

Subsequently, the terminals 68f of the signal connector unit 68 are inserted into the through holes 63b in the control board 63, and the convex portion 68e of the signal connector unit 68 is press-fitted into and firmly held by the holding hole 63a in the control board 63.

After that, the end face of the control board 63 at a side opposite to the signal connector unit 68 is placed into abutment against the positioning portion 62q of the housing 62, and the control board 63 is mounted on an upper portion of the housing 62 with the connector terminals Cm, the sensor terminals Sm2 of the housing 62, etc., being inserted into the through holes 63c in the control board 63. At this time, the convex portion 68c of the signal connector unit 68 is inserted into the concave portion 62k of the housing 62, and the engagement protrusion 68d is guided by and inserted into the engagement groove 62m, whereby the signal connector unit 68 is fitted into the housing 62, and the control board 63 is engaged by the engaging members 62n on the housing 62. Then, the signal connector unit 68 is firmly fastened to the housing 62 by screws 71.

Thereafter, the terminals 68f, Cm, Sm2 inserted into the through holes 63b, 63c are collectively soldered to the control board 63 by means of a partial jet.

The casing 65 is then inserted from above into the housing 62, and is fixedly secured to the heat sink 64 by bending or caulking the caulking pieces 65b. At this time, the lower end or engagement portions 65a of the casing 65 are inserted into the cut portions 62r while being guided by the sloped or inclined surfaces 62s.

Thereafter, the through holes 72a in the cap 72 are inserted over the motor terminals Mm, whereby the cap 72 is inserted into the opening 64b of the heat sink 64. At this time, the engaging portion 72b of the cap 72 is inserted into the groove 62t of the housing 62, and the convex portion 72c of the cap 72 passes over the convex portion 62u of the housing 62, whereby the cap 72 is engaged with the housing 62.

Next, the electric motor 30 and the control unit 60 separately assembled in the above manner are assembled with each other. First of all, the control unit 60 is firmly fastened to the bracket 39 of the electric motor 30 by means of screws 76, as shown in FIG. 3. At this time, an electric motor side connector 80b and a control unit side connector 80a of the rotational position sensor 3 (see FIG. 4) are engaged and electrically connected with each other. In addition, by mounting the heat sink 64 on the bracket 39 of the electric motor 30, the flange 72d of the cap 72 is clamped by the concave portion 64c of the heat sink 64 and the bracket 39, whereby the cap 72 is fixedly secured to the heat sink 64.

Finally, by fastening the winding terminals 37 of the electric motor 30 and the motor terminals Mm of the control unit 60 for electrical connection therebetween by means of screws 77, the electric motor 30 and the control unit 60 are integrally coupled with each other, and the assembly of the electric power steering apparatus is thus completed.

As described in the foregoing, in the electric power steering apparatus according to this embodiment, the control unit 60 is fixedly fastened to the bracket 39 of the electric motor 30 by means of the screws 76, and hence it is unnecessary to use external wiring and connectors for electrically connecting the electric motor 30 and the control unit 60 with each other. As a result, it is possible to reduce the cost of the apparatus as well as electric power loss, and to suppress the generation of radiation noise.

In addition, the control unit 60 is fixedly secured to the bracket 39 of the electric motor 30 by the screws 76, and the electric-motor side connector 80b and the control-unit side connector 80a of the rotational position sensor 3 are engaged and electrically connected with each other, as a consequence of which external wiring becomes unnecessary, thus making it possible to reduce the cost of the apparatus.

Moreover, since only small-current parts such as the microcomputer 13, the peripheral circuit elements, etc., are mounted on the control board 63, it is not necessary to increase the width and thickness of the wiring pattern on the control board 63, so components can be mounted on the control board 63 at high density, thereby making it possible to reduce the size of the control board 63 and the like.

Further, large-current parts such as the semiconductor switching elements Q1–Q6, the capacitors 7, the shunt resistors 8, etc., are mounted on the power board 61, which is mounted on the heat sink 64 made of aluminum in intimate contact therewith. With this arrangement, the heat generated from the large-current parts and the wiring pattern on the power board 61 is dissipated from the heat sink 64 to the outside air, and at the same time, it is dissipated from the heat sink 64 to the gear case 51 by way of the bracket 39 of the electric motor 30. As a result, a rise in temperature of the power board 61 and the components mounted thereon can be suppressed even if the power board 61 is reduced in size, and neither the heat resistance nor the durability of the wiring pattern are impaired.

Furthermore, the protrusions 64d are formed on one side of the heat sink 64 near the electric motor 30 so as to increase the heat dissipation area of the heat sink 64, and each of the protrusions 64d is of a columnar configuration. Thus, limitations on the direction of the flow of air due to forced air cooling or natural convection is small, resulting in increased degrees of freedom in the direction in which the control unit 60 is installed.

Still further, since the power connector 67 is disposed in the axial direction of the electric motor 30 at a side opposite to the motor terminals Mm with the connection member 66 interposed therebetween, the length of each conductive plate 90 can be shortened, thereby making it possible to reduce electric power loss. In addition, since the power connector 67 and the signal connector unit 68 are arranged at the same side of the housing 62, insertion and removal of the vehicle-side connector become easy, thus making it possible to improve installation thereof on a vehicle.

Moreover, the motor relays 69, which constitute a switch for turning on and off the motor current IM supplied from the bridge circuit 10 to the electric motor 30, are electrically connected through welding with a current path including the motor terminals Mm, but upon insertion of the motor relays 69, they are held by the housing 62. As a result, the motor relays 69 need not be held by other parts, and the efficiency of the welding operation can be improved.

Further, since the convex portions 62f made of the insulation resin of the housing 62 are formed on the switch-holding portions 62e for the motor relays 69, the motor relays 69 upon insertion thereof can be strongly held by the housing 62.

Furthermore, the switch-holding portions 62e for the motor relays 69 have low-rigidity portions 62g made of the insulation resin with their widths narrowed by the elongated holes 62v, so that when the motor relays 69 are inserted into the switch-holding portions 62e, the low-rigidity portions 62g are elastically deformed by the terminals 69a to expand the gaps of the switch-holding portions 62e. Accordingly, the insertion forces of the motor relays 69 can be reduced, and at the same time variations in thickness of the terminals 69a can be absorbed, thereby making it possible to improve the assemblability of the apparatus.

Still further, the power connector 67 integrally molded with the housing 62 has the terminals 67a formed at one ends of the conductive plates 90, and the coil 11 for preventing electromagnetic noise generated upon switching operation of the bridge circuit 10 from flowing out to the outside is electrically connected through welding with electric paths including the conductive plates 90, in such a manner that upon insertion of the coil 11, the power connector 67 is held by the housing 62. As a consequence, the coil 11 need not be held by other parts, and the operation efficiency of welding can be improved.

In addition, the coil receiving portion 62a is formed at its bottom with the holder portion 62b made of an insulation resin, and the holder portion 62b of the housing 62 has its inner diameter smaller than the outer diameter of the large-diameter portion 11b of the core 11a of a T-shaped vertical section, so that upon insertion of the coil 11, the large-diameter portion 11b of the core 11a is press-fitted into and held by the holder portion 62b of the housing 62. Thus, no additional components or parts are required, making it possible to reduce the cost of the apparatus.

Moreover, since the capacitors 7 for absorbing ripples in the motor current IM are firmly adhered to the housing 62 by the silicon adhesive 70, their vibration resistance can be improved, thereby enhancing the reliability of the apparatus.

Further, the beams 62h for reinforcement are integrally molded with the inner side of the housing 62 by the use of insulation resin, and the upper ends of those of the beams 62h which are arranged near the capacitors 7 have a height substantially equal to that of the upper ends of the capacitors 7, which are fixedly attached to the upper end portions of the beams 62h by means of the silicon adhesive 70. As a result, the assemblability or assembling efficiency of the apparatus can be improved.

Furthermore, since the casing 65 made of iron and mounted on the heat sink 64 so as to cover the power board 61, the housing 62 and the control board 63 is inserted into and held by the cut portions 62r of the engaging portion 62x formed on a side surface of the housing 62, it is possible to suppress the generation of unusual noise due to vibration of the casing 65.

Still further, the cut portions 62r have sloped or inclined surfaces 62s, respectively, with their opening widths increasing gradually from an inner side to an outer side, so that upon insertion of the casing 65, the lower end or engagement portions 65a of the casing 65 are inserted into the cut portions 62r while being guided by the sloped or inclined surfaces 62s, whereby the lower end or engagement portions 65a of the casing 65 are pushed against and fitted into the cut portions 62r. As a result, the insertion of the casing 65 into the housing 62 can be improved, and the "clearance or play" between the casing 65 and the housing 62 is removed to suppress the generation of unusual noise due to vibrations of these parts.

Besides, the heat sink 64 is formed with the opening 64b through which the motor terminals Mm are protruded or exposed to the outside, and the cap 72 made of the insulation resin and having the through holes 72a formed therein through which the motor terminals Mm can extend is inserted from the outside into the opening 64b, whereby the cap 72 is engaged with the housing 62 by making the convex portion 72c of the cap 72 pass over the convex portion 62u of the housing 62. Accordingly, it is not necessary to fasten the cap 72 to the housing 62 by using fastening elements such as screws, and hence the assemblability of the apparatus can be improved, thereby making it possible to reduce the manufacturing cost of the apparatus.

In addition, the cap 72 is formed with the flange 72d, and the concave portion 64c is formed in the heat sink 64 around its opening portion 64b, so that by mounting the heat sink 64 on the bracket 39 of the electric motor 30, the flange 72d of the cap 72 is clamped by the concave portion 64c of the heat sink 64 and the bracket 39, whereby the cap 72 is fixedly secured to the heat sink 64. With this arrangement, the vibration resistance of the apparatus can be improved, thereby enhancing the reliability thereof.

Moreover, the control board 63 is engaged by the engaging members 62n formed on the housing 62 at its upper opening end, and each of the engaging members 62n has a fallout-preventing portion 62p for preventing fallout of the control board 63, and a positioning portion 62q for positioning the control board 63 in its surface direction. With such an arrangement, the fallout prevention and positioning in the surface direction of the control board 63 can be carried out separately from each other, thus making it possible to improve the assemblability of the apparatus.

Further, since the fallout-preventing portions 62p of the engaging members 62n of the control board 63 and the positioning portion 62q are arranged adjacent to each other, the positioning of the control board 63 can be easily performed, thereby making it possible to improve the assemblability of the apparatus.

Furthermore, the concave portion 62k, into which the convex portion 68c of the signal connector unit 68 is inserted, is formed in a side wall of the housing 62 arranged in parallel with the row of connector terminals Cm of the connection member 66. Also, the linearly extending engagement groove 62m with a wide inlet opening is formed in the inner wall surface of the concave portion 62k of the housing 62, and the engagement protrusion 68d extending linearly so as to enclose the outer wall of the convex portion 68c of the signal connector unit 68 is formed on the outer wall of the convex portion 68c. With this arrangement, the insertion of the signal connector 68 into the housing 62 can be facilitated, thus improving the assemblability of the apparatus.

Still further, the width of the engagement portions of the engagement groove 62m and the engagement protrusion 68d are formed to gradually expand upwardly from a lower portion or bottom toward an upper portion or insertion opening in the direction of thickness of the side wall of the housing 62. Accordingly, it is possible to easily mount the control board 63 on an upper portion of the housing 62 by inserting the connector terminals Cm, the sensor terminals Sm2 of the housing 62, etc., into the through holes 63c in the control board 63, while placing the end face of the control board 63 at a side opposite to the signal connector unit 68 into abutment against the positioning portion 62q of the housing 62. As a result, the assemblability of the apparatus can be improved.

Although it is assumed in the above-mentioned embodiment that the number of magnetic poles of the permanent magnet 31 is eight and the number of salient poles of the stator 36 is twelve, the present invention is not limited to such a combination, but any combination of the number of magnetic poles and the number of salient poles may be employed for the purpose of the invention.

In addition, although an HITT substrate is used as the power board 61, the present invention is not limited to the use of such an HITT substrate. but there may instead be used a substrate having wiring patterns formed on a metal base of good heat conductivity such as aluminum or the like through the intermediary of an electric insulating layer. Also, other power boards of good heat conductivity such as a copper board, a ceramic board or the like can be used.

Moreover, although the resolver is used as the rotational position sensor 3, the present invention is not limited to the use of such a resolver, but other magnetic sensing elements such as magneto-resistive (MR) resistors, giant magneto-resistive (GMR) resistors, Hall elements, Hall ICs or the like may instead be used.

Further, the electric motor 30 is not limited to the blushless motor, but an induction motor, a switched reluctance motor (SR motor) or a brushed DC motor may instead be used. Also, three or more motor relays 69 may be employed. In addition, the screws are employed to fasten the respective component parts, but other fastening members such as rivets or the like may be used.

While the invention has been described in terms of a preferred embodiment, those skilled in the art will recognize that the invention can be practiced with modifications within the spirit and scope of the appended claims.

What is claimed is:

1. An electric power steering apparatus including an electric motor for generating assist torque to a steering wheel of a vehicle, and a control unit for controlling the driving of said electric motor, said control unit comprising: a power board having a bridge circuit mounted thereon which includes a plurality of semiconductor switching elements for switching an electric current supplied to said electric motor in accordance with the torque assisting the operation of said steering wheel; a capacitor mounted on said power board for absorbing ripples of the electric current; a control board at least having a microcomputer mounted thereon for generating a drive signal to control said bridge circuit based on steering torque of said steering wheel; a power connector electrically connected to a battery of the vehicle; a signal connector unit to and from which signals are input and output through external wiring; motor terminals electrically connected to said electric motor; a housing having a conductive plate constituting a wiring pattern and said motor terminals insert-molded of an insulation resin; a connection member mounted on said power board and having a plurality of terminals built therein for electrically connecting said power board, said housing and said control board to one another; and a heat sink disposed on said power board in surface contact therewith;

wherein said heat sink has a plurality of protrusions formed on its surface at a side opposite to said power board, wherein said capacitor is fixedly attached to said housing by means of an adhesive, and wherein said housing has a beam for reinforcement formed in the neighborhood of said capacitor, and said capacitor is fixedly attached to said beam.

2. An electric power steering apparatus including an electric motor for generating assist torque to a steering wheel of a vehicle, and a control unit for controlling the driving of said electric motor, said control unit comprising: a power board having a bridge circuit mounted thereon which includes a plurality of semiconductor switching elements for switching an electric current supplied to said electric motor in accordance with the torque assisting the operation of said steering wheel; a capacitor mounted on said power board for absorbing ripples of the electric current; a control board at least having a microcomputer mounted thereon for generating a drive signal to control said bridge circuit based on steering torque of said steering wheel; a power connector electrically connected to a battery of the vehicle; a signal connector unit to and from which signals are input and output through external wiring; motor terminals electrically connected to said electric motor; a housing having a conductive plate constituting a wiring pattern and said motor terminals insert-molded of an insulation resin; a connection member mounted on said power board and having a plurality of terminals built therein for electrically connecting said power board, said housing and said control board to one another; and a heat sink disposed on said power board in surface contact therewith;

wherein said heat sink has a plurality of protrusions formed on its surface at a side opposite to said power board, wherein said power connector and said signal connector unit are disposed in an axial direction of said electric motor at a side opposite to said motor terminals with said connection member interposed therebetween.

3. An electric power steering apparatus including an electric motor for generating assist torque to a steering wheel of a vehicle, and a control unit for controlling the driving of said electric motor, said control unit comprising: a power board having a bridge circuit mounted thereon which includes a plurality of semiconductor switching elements for switching an electric current supplied to said electric motor in accordance with the torque assisting the operation of said steering wheel; a capacitor mounted on said power board for absorbing ripples of the electric current; a control board at least having a microcomputer mounted thereon for generating a drive signal to control said bridge circuit based on steering torque of said steering wheel; a power connector electrically connected to a battery of the vehicle; a signal connector unit to and from which signals are input and output through external wiring; motor terminals electrically connected to said electric motor; a housing having a conductive plate constituting a wiring pattern and said motor terminals insert-molded of an insulation resin; a connection member mounted on said power board and having a plurality of terminals built therein for electrically connecting said power board, said housing and said control board to one another; and a heat sink disposed on said power board in surface contact therewith;

wherein said heat sink has a plurality of protrusions formed on its surface at a side opposite to said power board, wherein said motor terminals are formed on one end of said conductive plate, and a switch for turning on and off the motor current supplied to said electric motor is disposed on an electric path including said conductive plate connected to at least one of said motor terminals, said switch being held by said housing.

4. The electric power steering apparatus as set forth in claim 3, wherein said housing has a switch-holding portion made of said insulation resin, and said switch has a terminal electrically connected with said conductive plate and is held by said housing with its terminal clamped by said conductive plate and said switch-holding portion of said housing.

5. The electric power steering apparatus as set forth in claim 4, wherein said switch-holding portion is formed with a convex portion protruding toward its terminal side.

6. The electric power steering apparatus as set forth in claim 4, wherein said switch-holding portion is formed with a low-rigidity portion.

7. The electric power steering apparatus as set forth in claim 6, wherein said low-rigidity portion is a portion of a narrow width provided by an elongated hole formed in an insulation resin portion of said housing in the neighborhood of said terminal of said switch.

8. An electric power steering apparatus including an electric motor for generating assist torque to a steering wheel of a vehicle, and a control unit for controlling the driving of said electric motor, said control unit comprising: a power board having a bridge circuit mounted thereon which includes a plurality of semiconductor switching elements for switching an electric current supplied to said electric motor in accordance with the torque assisting the operation of said steering wheel; a capacitor mounted on said power board for absorbing ripples of the electric current; a control board at least having a microcomputer mounted thereon for generating a drive signal to control said bridge circuit based on steering torque of said steering wheel; a power connector electrically connected to a battery of the vehicle; a signal connector unit to and from which signals are input and output through external wiring; motor terminals electrically connected to said electric motor; a housing having a conductive plate constituting a wiring pattern and said motor terminals insert-molded of an insulation resin; a connection member mounted on said power board and having a plurality of terminals built therein for electrically connecting said power board, said housing and said control board to one another; and a heat sink disposed on said power board in surface contact therewith;

wherein said heat sink has a plurality of protrusions formed on its surface at a side opposite to said power board, and wherein said power connector has terminals formed at one end of said conductive plate, and a coil for preventing noise generated upon switching operation of said bridge circuit from flowing out to the outside is disposed on electric paths including said conductive plate, said coil being held by said housing.

9. The electric power steering apparatus as set forth in claim 8, wherein said coil comprises a core of a T-shaped cross-sectional configuration having a large-diameter portion and a small-diameter portion, and a coil portion wound around said small-diameter portion, and said housing has a holder portion into which said large-diameter portion of said core is fitted.

10. An electric power steering apparatus including an electric motor for generating assist torque to a steering wheel of a vehicle, and a control unit for controlling the driving of said electric motor, said control unit comprising: a power board having a bridge circuit mounted thereon which includes a plurality of semiconductor switching elements for switching an electric current supplied to said electric motor in accordance with the torque assisting the operation of said steering wheel; a capacitor mounted on said power board for absorbing ripples of the electric current; a control board at least having a microcomputer mounted thereon for generating a drive signal to control said bridge circuit based on steering torque of said steering wheel; a power connector electrically connected to a battery of the vehicle; a signal connector unit to and from which signals are input and output through external wiring; motor terminals electrically connected to said electric motor; a housing having a conductive plate constituting a wiring pattern and said motor terminals insert-molded of an insulation resin; a connection member mounted on said power board and having a plurality of terminals built therein for electrically connecting said power board, said housing and said control board to one another; and a heat sink disposed on said power board in surface contact therewith;

wherein said heat sink has a plurality of protrusions formed on its surface at a side opposite to said power board, and wherein said housing is formed at a side surface thereof with an engaging portion that has cut portions at opposite ends thereof, respectively, and a metal casing covering said control board, said housing and said power board to form an electromagnetic shield is fixedly secured to said housing by being inserted into said cut portions.

11. The electric power steering apparatus as set forth in claim 10, wherein each of said cut portions has a sloped surface with its opening width increasing gradually from an inner side to an outer side, and said casing has engagement portions formed at its side near said heat sink, said engagement portions being elastically engaged with said sloped surfaces, respectively.

12. An electric power steering apparatus including an electric motor for generating assist torque to a steering wheel of a vehicle, and a control unit for controlling the driving of said electric motor, said control unit comprising: a power board having a bridge circuit mounted thereon which includes a plurality of semiconductor switching elements for switching an electric current supplied to said electric motor in accordance with the torque assisting the operation of said steering wheel; a capacitor mounted on said power board for absorbing ripples of the electric current; a control board at least having a microcomputer mounted thereon for generating a drive signal to control said bridge circuit based on steering torque of said steering wheel; a power connector electrically connected to a battery of the vehicle; a signal connector unit to and from which signals are input and output through external wiring; motor terminals electrically connected to said electric motor; a housing having a conductive plate constituting a wiring pattern and said motor terminals insert-molded of an insulation resin; a connection member mounted on said power board and having a plurality of terminals built therein for electrically connecting said power board, said housing and said control board to one another; and a heat sink disposed on said power board in surface contact therewith;

wherein said heat sink has a plurality of protrusions formed on its surface at a side opposite to said power board, and wherein said heat sink is formed with an opening through which said motor terminals are exposed to the outside, and a cap molded of an insulation resin and having through holes through which said motor terminals can extend is inserted into said opening, and said cap has its one end which is extended through said opening to be engaged with said housing.

13. The electric power steering apparatus as set forth in claim 12, wherein said cap is formed with a flange which is clamped between said heat sink and said electric motor.

14. An electric power steering apparatus including an electric motor for generating assist torque to a steering wheel of a vehicle, and a control unit for controlling the driving of said electric motor, said control unit comprising: a power board having a bridge circuit mounted thereon which includes a plurality of semiconductor switching elements for switching an electric current supplied to said electric motor in accordance with the torque assisting the operation of said steering wheel; a capacitor mounted on said power board for absorbing ripples of the electric current; a control board at least having a microcomputer mounted thereon for generating a drive signal to control said bridge circuit based on steering torque of said steering wheel; a power connector electrically connected to a battery of the vehicle; a signal connector unit to and from which signals are input and output through external wiring; motor terminals electrically connected to said electric motor; a housing having a conductive plate constituting a wiring pattern and said motor terminals insert-molded of an insulation resin; a connection member mounted on said power board and having a plurality of terminals built therein for electrically connecting said power board, said housing and said control board to one another; and a heat sink disposed on said power board in surface contact therewith;

wherein said heat sink has a plurality of protrusions formed on its surface at a side opposite to said power board, and wherein said control board is engaged by an engaging member formed on said housing at its opening end, and said engaging member has a fallout-preventing portion formed in a fallout direction of said control board for preventing fallout of said control board, and a positioning portion for positioning said control board in its surface direction.

15. The electric power steering apparatus as set forth in claim 14, wherein said fallout-preventing portion and said positioning portion are disposed adjacent to each other.

16. An electric power steering apparatus including an electric motor for generating assist torque to a steering wheel of a vehicle, and a control unit for controlling the driving of said electric motor, said control unit comprising: a power board having a bridge circuit mounted thereon which includes a plurality of semiconductor switching elements for switching an electric current supplied to said electric motor in accordance with the torque assisting the operation of said steering wheel; a capacitor mounted on said power board for absorbing ripples of the electric current; a control board at least having a microcomputer mounted thereon for generating a drive signal to control said bridge circuit based on steering torque of said steering wheel; a power connector electrically connected to a battery of the vehicle; a signal connector unit to and from which signals are input and output through external wiring; motor terminals electrically connected to said electric motor; a housing having a conductive plate constituting a wiring pattern and said motor terminals insert-molded of an insulation resin; a connection member mounted on said power board and having a plurality of terminals built therein for electrically connecting said power board, said housing and said control board to one another; and a heat sink disposed on said power board in surface contact therewith;

wherein said heat sink has a plurality of protrusions formed on its surface at a side opposite to said power board, and wherein said housing is formed, on its side wall parallel to a row of terminals of said connection member, with a concave portion into which a convex portion of said signal connector unit is fitted.

17. The electric power steering apparatus as set forth in claim 16, wherein said convex portion is formed with an engagement protrusion, and said engagement protrusion is fitted into an engagement groove that is formed in said concave portion and has a width in a thickness direction of said side wall increasing from a bottom portion toward an insertion opening.

* * * * *